(12) United States Patent
Shore

(10) Patent No.: US 6,405,324 B2
(45) Date of Patent: Jun. 11, 2002

(54) CIRCUIT AND METHOD FOR MASKING A DORMANT MEMORY CELL

(75) Inventor: Michael Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/765,212

(22) Filed: Jan. 16, 2001

Related U.S. Application Data

(63) Continuation of application No. 09/103,763, filed on Jun. 24, 1998, now Pat. No. 6,195,762.

(51) Int. Cl.[7] .............................................. G06F 11/00
(52) U.S. Cl. ............................................. 714/8; 714/11
(58) Field of Search ............................. 714/8, 711, 710

(56) References Cited

U.S. PATENT DOCUMENTS

| | | | |
|---|---|---|---|
| 4,827,452 A | 5/1989 | Toyama | 365/200 |
| 4,860,260 A | 8/1989 | Saito | 365/200 |
| 6,208,570 B1 * | 3/2001 | Brown | 365/201 |
| 6,252,809 B1 * | 6/2001 | Kim | 365/200 |

OTHER PUBLICATIONS

Sedra and Smith "Microelectronic Circuits: Fourth Edition" copyright 1998, New York, Oxford University Press, p. 1125.

* cited by examiner

*Primary Examiner*—Robert Beausoleil
*Assistant Examiner*—Bryce P. Bonzo
(74) *Attorney, Agent, or Firm*—Dorsey & Whitney LLP

(57) ABSTRACT

An integrated circuit includes an array of memory cells, storage circuits and a write circuit coupled to the array, and a control circuit coupled to the array and write circuit. The write circuit is operable to receive initial test data and mask data. The control circuit is operable to enable the write circuit to write the initial test data to the cells, to receive an address of one of the cells, to enable the write circuit if the addressed cell is dormant to write the mask data to the storage circuit coupled to the cell such that the storage circuit stores the mask data, and to allow reading of the cell such that if the cell is dormant, then the storage circuit provides as a read value the stored mask data, and such that if the cell is live, then the storage circuit provides as the read value data that is stored in the cell.

18 Claims, 9 Drawing Sheets

CIRCUIT AND METHOD FOR MASKING A DORMANT MEMORY CELL

CROSS-REFERENCE TO RELATED APPLICATION

This application is a continuation of U.S. patent application Ser. No. 09/103,763, filed Jun. 24, 1998, now U.S. Pat. No. 6,195,762.

TECHNICAL FIELD

The invention relates generally to electronic circuits and more particularly to a circuit and method for allowing testing of a memory array with a repair solution disabled. For some embodiments of the invention, this entails allowing data access to a dormant memory cell. For example, a memory cell is dormant if it is a matrix memory cell that is replaced with a redundant memory cell, or if it is a redundant memory cell that, after repair of the matrix array, is unused.

BACKGROUND OF THE INVENTION

For integrated circuits that include a memory array, the matrix memory cells are usually tested and, if necessary, repaired before the circuits are shipped to customers. If a matrix cell is found to be defective, it is replaced with a redundant memory cell. Specifically, an address decoder is programmed to map the redundant cell to the address of the defective matrix cell and to disable data access to the defective cell. Therefore, when an external circuit reads data from or writes data to this address, the address decoder deactivates the defective matrix cell, activates the redundant cell, and reroutes the data from (read) or to (write) the redundant cell. The rerouting and disabling program executed by the address decoder is often called the repair solution for the matrix array. Furthermore, for layout and circuit simplicity, many address decoders are designed to replace the entire matrix row or column containing the defective matrix cell with a redundant row or column, respectively.

One problem is that after such testing and repair of the matrix array, the redundant array often cannot be tested, and the matrix array often cannot be tested without implementing the repair solution. Such "back-end" tests (i.e., tests performed after repair of the matrix array) require a tester that has the capability to determine and store the addresses of the defective matrix cells during matrix-array testing and the unused redundant cells during redundant-array testing and to ignore errors that occur when these dormant cells are accessed. Unfortunately, due to its high cost, such a tester is usually reserved for the initial testing and repair described above, and a much cheaper back-end tester is used to test the matrix array after repair. Although such a back-end tester can test the matrix array with the repair solution enabled, it typically cannot test the matrix array with the repair solution disabled, or test the redundant array after the matrix array has been repaired. Therefore, such back-end testing of the matrix and redundant arrays is rarely, if ever performed.

One reason for testing the matrix array with the repair solution disabled is discussed with reference to FIG. 1, which is a schematic diagram of a portion of a Dynamic Random Access Memory (DRAM) array 10. The array 10 includes a matrix array 11 having rows $R_0$-$R_N$ of matrix cells 12 and a redundant array 13 having redundant rows $RR_0$-$RR_N$ of redundant cells 14. The matrix and redundant arrays 11 and 13 share common digit lines D and $\overline{D}$, which are coupled to a sense amplifier 15. Furthermore, the array 10 incorporates a folded-digit-line architecture such that the cells 12 and 14 in the even rows ($R_0$, $R_2$, ..., $RR_0$) are coupled to the digit line D and the cells 12 and 14 in the odd rows ($R_1$, $R_3$, ..., $RR_N$) are coupled to the complimentary digit line $\overline{D}$.

During voltage-stress tests of the array 10, a tester drives known logic levels onto the digit lines D and $\overline{D}$ at appropriate times so as to stress the cells 12 and 14 in a desired manner. Thus, the testing apparatus must calculate the appropriate logic levels with which to drive the external data pins (not shown in FIG. 1) of the array 10 so as to place the desired logic levels on the digit lines D and $\overline{D}$. The relationship between the external logic levels and digit-line logic levels is referred to as the data topology of the array 10, which is often abbreviated as the "data topo." Likewise, the testing apparatus must calculate the respective addresses that fire the row lines R and RR. The relationship between the addresses and the row lines is called the address topology, which is often abbreviated as the "address topo." Before the initial testing of the array 10, the testing apparatus is programmed with the array's address and data topo equations so that it can test the array 10 and determine if any of the matrix cells 12 or redundant cells 14 are defective. For example, suppose the tester must drive a logic 1 onto an external data pin to force the sense amplifier 15 to drive a logic 1 onto line D and a logic 0 onto line $\overline{D}$. Then it follows that the tester must drive a logic 0 onto the external data pin to force the sense amplifier to drive a logic 0 onto line D and a logic 1 onto line $\overline{D}$. Likewise, if the tester reads a logic 1 from the external data pin, it determines that line D is at logic 1 and line $\overline{D}$ is at logic 0, and if the tester reads a logic 0 from the external data pin, then it determines that line D is at logic 0 and line $\overline{D}$ is at logic 1. Thus, these known sets of values compose parts of the data and address topos of the array 10.

The implementation of a repair solution, however, may change the data topo, and thus for some matrix rows may change the relationship between the logic level on the external data pin and the logic levels on line D and line $\overline{D}$ during such tests. When a matrix cell 12 is found to be defective, then the address decoder (not shown in FIG. 1) is programmed to map a redundant row RR to the address of the row R that includes the defective matrix cell 12. For example, if a matrix cell 12 in the row $R_0$ is defective, then the entire row $R_0$ is determined to be defective, and the address decoder is programmed to replace the entire row $R_0$ with a redundant row RR. Because the defective matrix row $R_0$ is an even row, if the address decoder replaces it with an even redundant row such as $RR_0$, then the redundant row will have the same data topo as the defective row, and the data topo equations can remain the same for testing the array 10 with the repair solution enabled. Conversely, if the defective row $R_0$ is replaced with an odd redundant row such as $RR_N$, then the redundant row has a different data topo than the defective row. More specifically, suppose one wants to write logic 1 to the matrix cells 12 in the row $R_0$. Then according to the data topo described above, the tester writes a logic 1 to the external data pin. If the row $R_0$ is replaced with row $RR_0$, then the logic 1 is written to the memory cells 14 in that row as intended, and the data topo remains the same. But if the row $R_0$ is replaced with $RR_N$, then a logic 0, not a logic 1, is written to the memory cells 14 in that row, and the data topo is different.

In addition to changing the data topo, the implementation of the repair solution may also prevent certain types of testing from being performed. For example, during a cell leakage test, the tester uses the data topo equations to write a first logic level to a cell 12 or 14 under test and a second logic level to the cells 12 or 14 adjacent to and surrounding the cell under test. (During such a test, the tester can address the array 10 as an entire array having rows $R_0$-$RR_N$ instead of two separate arrays 11 and 13 having rows $R_0$-$R_N$ and $RR_0$-$RR_N$, respectively.) Storing the opposite logic level in all of the surrounding cells creates a maximum voltage differential between these cells and the cell under test, and thus creates a worst-case leakage scenario for the cell under test. Then, the tester reads the data stored in the cell under test. If the data is equal to the first logic level, then the tester determines that the cell under test has acceptable leakage properties. But if the data is equal to the second logic level, the tester determines that the cell under test is defective because leakage between it and the surrounding cells caused a corruption of the data stored in the cell under test. If the repair solution is implemented, however, one or more of the surrounding cells may be inaccessible, and thus the worst-case leakage scenario may be unattainable for some cells under test. For example, suppose a cell 12 under test is in row $R_0$, and that row $R_1$ is defective and has been replaced with a redundant row RR. Often, only one cell 12 in the row $R_1$ is defective. Therefore, the remaining cells 12 in the row $R_1$ are available for storing test data to allow worst-case leakage testing of the cells 12 in the row $R_0$. But with the repair solution enabled, none of the cells 12 in the row $R_1$ can be written to, and thus the cells 12 in the row $R_0$ cannot be subjected to a worst-case leakage test. Furthermore, suppose the cell under test is in the last matrix row $R_N$ or in the redundant row $RR_1$, which are adjacent to the first redundant row $RR_0$. With the repair solution enabled, the row $RR_0$ is accessible only if it is used to replace a redundant row. If it is dormant, however, then the cells 14 in the row $RR_0$ are inaccessible, and the cells 12 in the row $R_N$ and the cells 14 in the row $RR_1$ cannot be subjected to a worst-case leakage test.

One way to leakage test the entire array 10 after it has been repaired and without calculating a new data topo is to disable the repair solution so that all of the rows, even the defective matrix rows R and the unused redundant rows RR, are accessible to the tester. Although this would allow the tester to use the original data topo, the tester would have to calculate and store the repair solution so that it could avoid reading the defective matrix rows or unused redundant rows, or so that if the tester did read these dormant rows, it could ignore errors from these rows. (Although an unused redundant row may not include any defective cells 14, it may be disabled such that the cells 14 cannot be accessed.) If the tester did not do this, then it would falsely indicate that the part under test is defective, when in fact these defects are already mapped out by the repair solution. But as discussed above, a back-end tester typically cannot calculate and store a repair solution, and a tester that is relatively expensive and thus reserved for initial testing and repair. Furthermore, to increase back-end testing throughput, it is often desirable to test multiple circuits in parallel. Therefore, even if the tester could store a repair solution, it would have to store a different repair solution for each of the circuits. Unfortunately, even the most sophisticated testers often lack the ability to store multiple repair solutions. And even if a tester could store multiple repair solutions, the time required to calculate and store the repair solution for each circuit would be very time consuming, and thus would considerably slow down the testing throughput.

Additionally, changes in the data topo caused by the repair solution may hinder or prevent back-end tests other than the leakage test.

SUMMARY OF THE INVENTION

In one aspect of the invention, an integrated circuit includes an array of memory cells, storage circuits and a write circuit coupled to the array, and a control circuit coupled to the array and write circuit. The write circuit is operable to receive initial test data and mask data. The control circuit is operable to enable the write circuit to write the initial test data to the cells, to receive an address of one of the cells, to enable the write circuit to write the mask data to the storage circuit coupled to the cell such that the storage circuit stores the mask data if the addressed cell is dormant, and to allow reading of the cell such that if the cell is dormant, then the storage circuit provides as a read value the stored mask data, and such that if the cell is live, then the storage circuit provides as the read value data that is stored in the cell.

Such circuits allow a back-end tester to access all memory cells in a matrix array when the repair solution is disabled, and to access all memory cells in a redundant array after the repair solution has been implemented without storing the repair solution. Furthermore, because the tester need not store the repair solution, it can test multiple circuits in parallel.

DETAILED DESCRIPTION OF THE INVENTION

Figure 1:
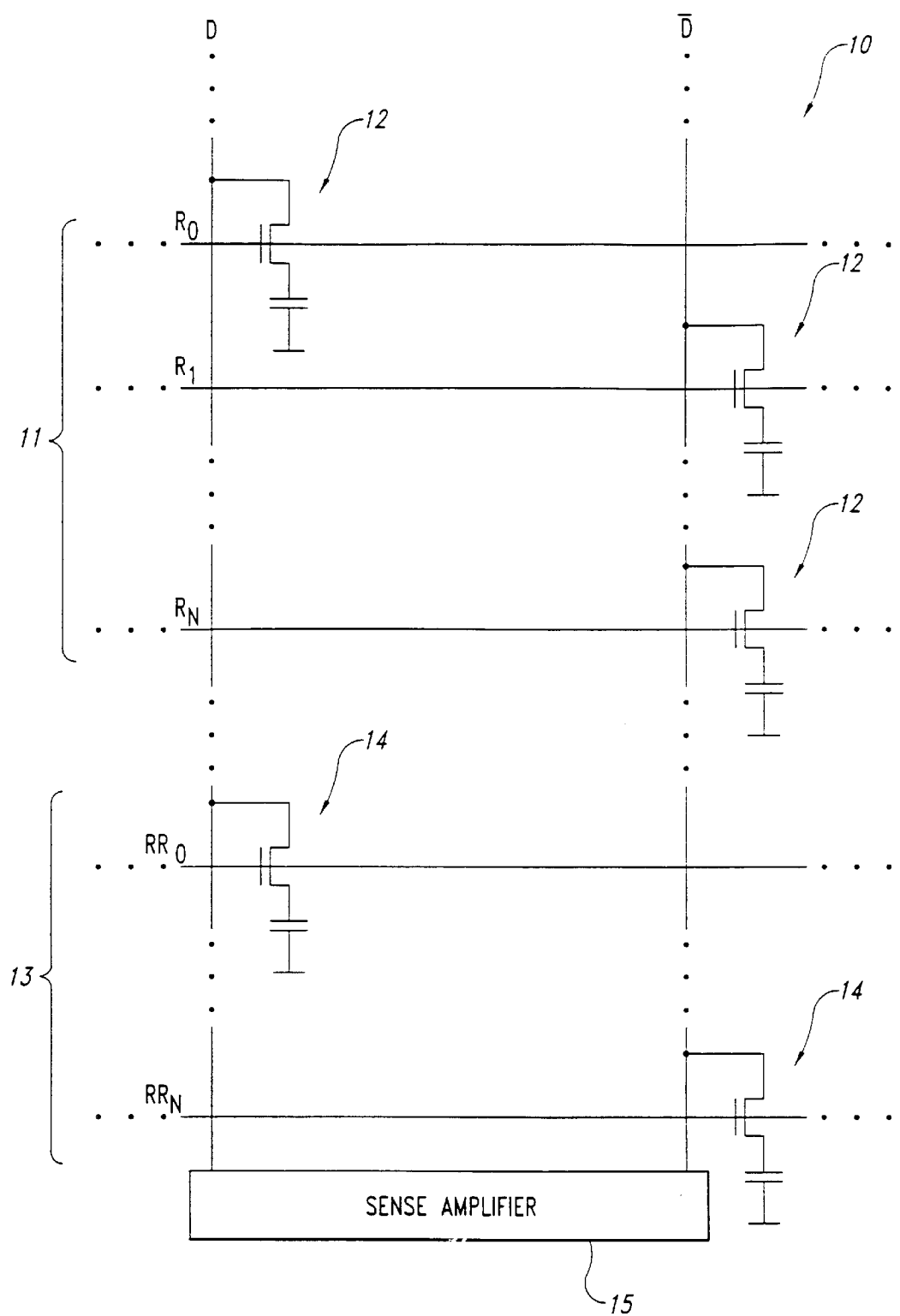
FIG. 1 is a schematic diagram of a portion of a conventional DRAM array.
Figure 2:
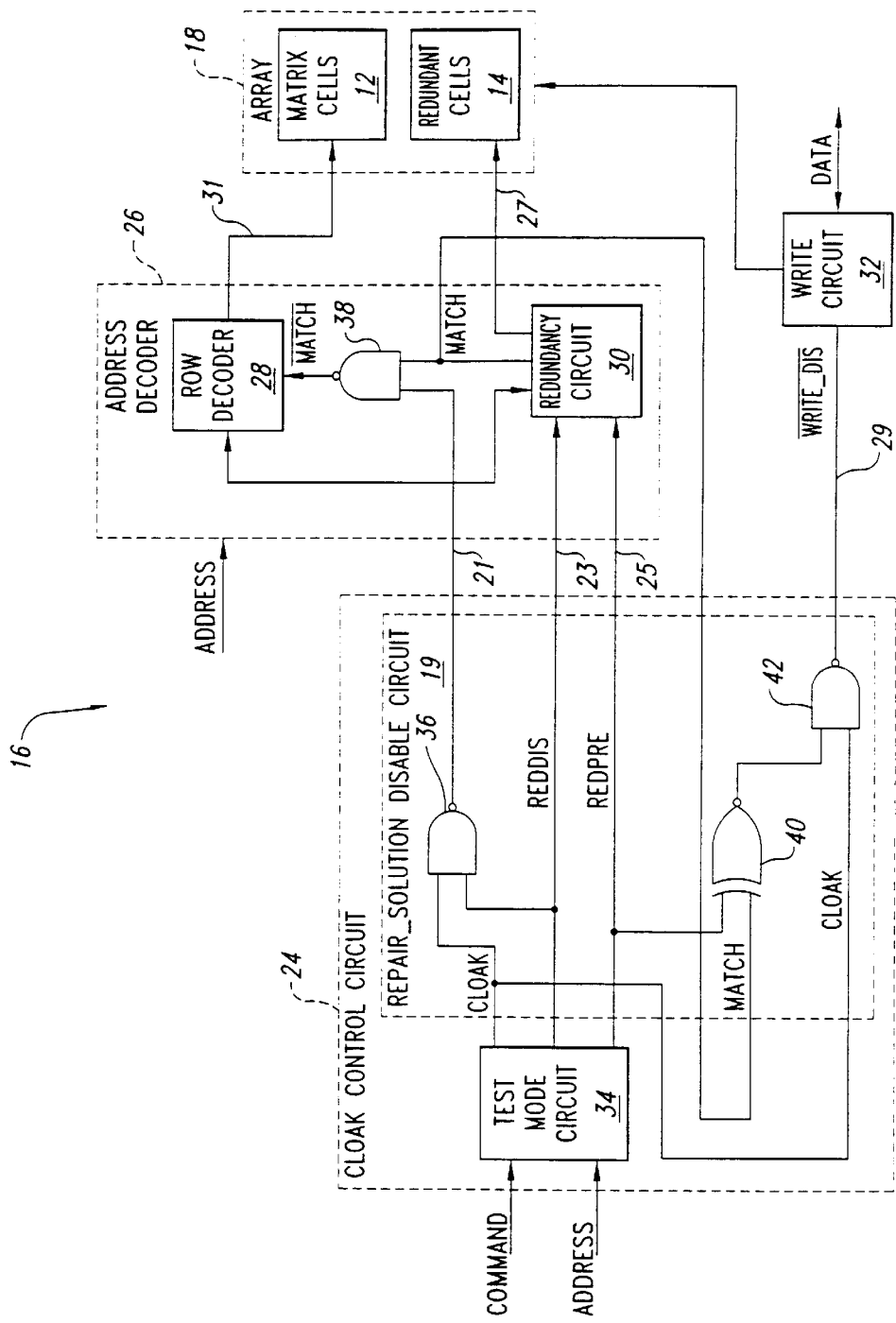
FIG. 2 is a schematic block diagram of a circuit that includes an embodiment of a cloak control circuit according to the invention.

FIG. 2 is a schematic diagram of a control circuit 16 that allows a conventional back-end tester (not shown in FIG. 2), which cannot store a repair solution, to test one or more memory arrays 18 with the repair solution disabled. As discussed below, the circuit 16 allows the tester to write mask, i.e., cloak, data to a dormant memory cell immediately before reading the cell such that the cloak data "fools" the tester into determining that the dormant cell is operating properly. In one embodiment, the array 18 has a folded-digit-line architecture, includes respective arrays of matrix cells 12 and redundant cells 14, and is otherwise similar to the array 10 of FIG. 1.

More specifically, during such a test, because the tester does not store the repair solution of the array 18, it assumes that every matrix and redundant memory cell is accessible and operational, i.e., live, and thus tests each matrix and redundant memory cell in the array 18. For example, during a leakage test, the tester tests a dormant cell in the same manner as it tests a live cell. That is, the tester writes a first logic level to the dormant cell and writes a second logic level to the surrounding cells. (Here, "write" denotes activating and coupling data to the memory cell regardless of the cell's ability or inability to store the data written to it.) It then reads the dormant cell. (Here, "read" denotes activating the memory cell and reading the data on the bit line or lines coupled thereto regardless of whether the cell is defective or properly functioning.) If the dormant cell is truly defective, then there is a good chance that without the control circuit 16, the tester would read the second logic level from the dormant cell, and thus determine that the dormant cell is defective. As stated in the background, however, this defect is accounted for in the repair solution, and detection at this point unnecessarily labels the array 18 as defective. This may cause the array 18, which is not defective with the repair solution enabled, to be mistakenly discarded. Therefore, when the tester tests a dormant cell, the control circuit 16 causes the tester to read the first logic level even if the dormant cell did not store the first logic level. This occurs as follows. Immediately before reading each cell under test, the write circuit again applies the first logic level to the digit lines for the cell. If the cell is live, the control circuit 16 disables the cell from being written to, and the tester then reads the cell in the normal manner as if the above operation never occurred. If the cell is dormant, however, the circuit 16 causes the first logic level to be stored in the sense amplifier for the column containing the dormant cell. The tester then reads the first logic level that is stored in the sense amplifier, and thus detects no defect even if the dormant cell was unable to store the applied logic level. Therefore, the data applied to the dormant cell just prior to reading is called the cloak data because it cloaks a defect in the dormant cell that the tester might otherwise detect. In another embodiment, instead of using the sense amplifier, the circuit 16 causes the cloak data to be stored in and read from a latch that is coupled to the dormant cell. Furthermore, because the cloak data is stored in the sense amplifier or a latch coupled to the dormant cell, the circuit 16 need not fire the dormant cell during the writing or reading of the cloak data.

Still referring to FIG. 2, one embodiment of the control circuit 16 includes cloak control circuit 24, which is coupled to ADDRESS and COMMAND buses and includes a repair-solution disable circuit 19. The circuit 24 is coupled to a conventional address decoder 26, which is coupled to an ADDRESS bus and includes a conventional row decoder 28 and redundancy circuit 30. The control circuit 16 can be incorporated into any circuit that includes a memory array, such as a DRAM or processor. In this embodiment, in addition to the array 18, the circuit incorporating the control circuit 16 also includes a write circuit 32, which is coupled to a DATA bus.

The control circuit 24 operates in one of three different operating modes, namely a normal mode, a redundancy disable mode, and a redundancy pretest mode. During the normal mode of operation, the control circuit 24 allows the address decoder 26 to implement a repair solution. Therefore, if a live row of matrix cells 12 is written to or read from, the address decoder 26 fires this row via a bus 31. Conversely, if a dormant row of matrix cells 12 is written to or read from, the address decoder does not fire this row, but instead fires a corresponding row of redundant cells 14 via a bus 27 and reroutes data to and from this redundant row.

During the redundancy disable mode of operation, the control circuit 24 prohibits the address decoder 26 from implementing the repair solution and allows direct read/write access to all of the rows of matrix cells 12. If a live row of matrix cells 12 is written to or read from, then the address decoder 26 fires this row via a bus 31 as in the normal mode. But unlike the normal mode, if a dormant row of matrix cells 12 is written to or read from, then the address decoder does not fire or reroute data to the corresponding redundant row. Instead, the control circuit 24 cloaks the defect in the dormant cell by storing the cloak data in the sense amplifier coupled to the dormant cell, as described above. The correct data that would have been stored in the dormant cell if it had been operating can then be read by the tester.

During the redundancy pretest mode of operation, the control circuit 24 prohibits the address decoder 26 from implementing the repair solution and allows direct read/write access to all of the rows of redundant cells 14. If a live or dormant row of redundant cells 14 is written to or read from, then the address decoder 26 fires this row via the bus 27 and does not fire any rows of matrix cells 12. Furthermore, the control circuit 24 cloaks a dormant redundant row of cells 14 using the above-described cloaking procedure. As discussed above, a dormant redundant row is typically disabled such that reading test data from such a row would normally show an error. The cloaking procedure, however, cloaks the dormant redundant row so that the tester detects no errors.

More specifically and still referring to FIG. 2, the cloak control circuit 24 includes a test mode circuit 34, which receives a mode command on a COMMAND bus and an address key on an ADDRESS bus. In response to the mode command and respective address keys, the circuit 34 generates signals CLOAK, REDDIS (redundancy disable), and REDPRE (redundancy pretest) which put the control circuit 16 in one of the above three modes. In the normal mode, all three signals are inactive logic 0. In the redundancy disable mode, CLOAK and REDDIS are active logic 1 and REDPRE is inactive logic 0. And in the redundancy pretest mode, CLOAK and REDPRE are active logic 1 and REDDIS is inactive logic 0.

The redundancy circuit 30 generates an inactive logic 0 for a signal MATCH whenever a live row of matrix cells 12 is addressed, and generates MATCH active logic 1 when a dormant row of cells 12 is addressed. As discussed below, when the repair solution is enabled, a NAND gate 38 inverts MATCH to generate $\overline{\text{MATCH}}$. When a live row of cells 12 is addressed, the inactive logic 1 for $\overline{\text{MATCH}}$ enables the row decoder 28 to fire the addressed row via a bus 31. Conversely, when a dormant row of cells 12 is addressed, the active logic 0 for $\overline{\text{MATCH}}$ prevents the row decoder 28 from firing the dormant row. During the normal mode, REDDIS and REDPRE, which are both inactive logic 0, allow the circuit 30 to fire a corresponding row of redundant cells 14 via a bus 27 to replace an addressed dormant row of cells 12. During the redundancy disable mode, REDDIS and REDPRE, which are active logic 1 and inactive logic 0, respectively, prevent the circuit 30 from firing a corresponding row of redundant cells 14 when a dormant row of cells 12 is addressed. During the redundancy pretest mode, REDDIS and REDPRE, which are inactive logic 0 and active logic 1, respectively, cause the circuit 30 to fire addressed rows of redundant cells 14 regardless as to whether the addressed redundant rows are live or dormant.

A NAND gate 36 disables the address decoder 26 from implementing the repair solution for the array of matrix cells 12 during the redundancy disable mode. During the redundancy disable mode when both CLOAK and REDDIS are active logic 1, the gate 36 generates a logic 0 on the line 21. This logic 0 disables the NAND gate 38 by forcing it to generate an inactive logic 1 for $\overline{\text{MATCH}}$ regardless of the level of MATCH. Thus, even when a dormant row of matrix cells 12 is addressed and MATCH is an active logic 1, the inactive logic 1 for $\overline{\text{MATCH}}$ allows the row decoder 28 to fire the dormant row.

An XNOR gate 40 and a NAND gate 42 together control when cloak data is allowed to be written to the array 18. During the normal mode, the inactive 0 for CLOAK causes the NAND gate 42 to generate an inactive logic 1 for $\overline{\text{WRITE\_DIS}}$ regardless of the logic level generated by the gate 40. Therefore, the write circuit 32 is always enabled to allow normal data writing to the array 18. During the redundancy disable mode, the active 1 for CLOAK makes the output of the NAND gate 42 dependent on the output of the gate 40. If a live row of matrix cells 12 is addressed the inactive logic 0 for both MATCH and REDPRE cause the gate 40 to generate a logic 1, which causes the gate 42 to generate an active logic 0 for $\overline{\text{WRITE\_DIS}}$. Thus, the disabled write circuit 32 prevents the writing of cloak data to the addressed live row. Conversely, if a dormant row of matrix cells 12 is addressed, the active logic 1 for MATCH and inactive logic 0 for REDPRE cause the gate 40 to generate a logic 1, which causes the gate 42 to generate an inactive logic 1 for $\overline{\text{WRITE\_DIS}}$. Thus, the enabled write circuit 32 allows the storing of cloak data in the sense amplifiers in the addressed dormant row. During the redundancy pretest mode, the active 1 for CLOAK still makes the output of the NAND gate 42 dependent on the output of the gate 40. If a dormant row of redundant cells 14 is addressed, the inactive logic 0 for MATCH and the active logic 1 for REDPRE cause the gate 40 to generate a logic 0, which causes the gate 42 to generate an inactive logic 1 for $\overline{\text{WRITE\_DIS}}$. Thus, the enabled write circuit 32 allows the storing of cloak data in the sense amplifiers in the addressed dormant row. Conversely, if a live row of redundant cells 14 is addressed, the active logic 1 for both MATCH and REDPRE cause the gate 40 to generate a logic 1, which causes the gate 42 to generate an active logic 0 for $\overline{\text{WRITE\_DIS}}$. Thus, the disabled write circuit 32 prevents the storing of cloak data in the sense amplifiers in the addressed live redundant row.

The detailed operation of the control circuit 16 during the redundancy disable and redundancy pretest modes is now discussed in conjunction with FIGS. 2, 3A–3B, and 4A–4B.

Figure 3A:
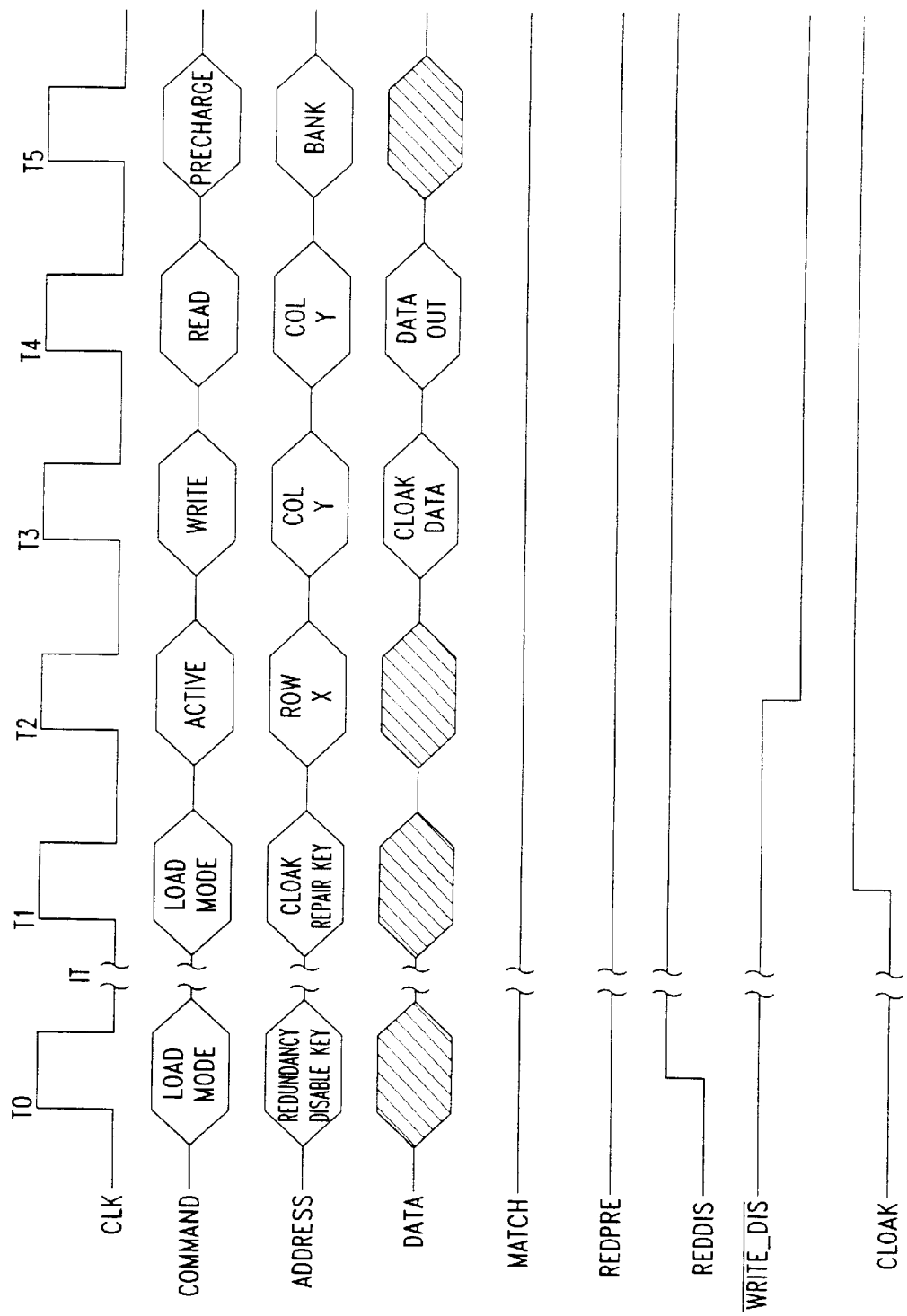
FIG. 3A is a timing diagram for the signals of FIG. 2 during testing of a redundant cell that is mapped to replace a matrix cell.

FIG. 3A is a timing diagram of the signals of FIG. 2 during the redundancy disable mode when a live row of matrix cells 12 is addressed. As discussed below, because the row is live, the control circuit 24 disables data cloaking for this row. Referring to FIGS. 2 and 3A, at the beginning of the redundancy disable mode during a first clock cycle T0, the tester drives a MODE command onto a COMMAND bus and a REDUNDANCY DISABLE key onto the ADDRESS bus. In response, the test mode circuit 34 generates an active logic 1 for REDDIS and continues to generate an inactive logic 0 for REDPRE.

During an interval IT between clock cycles T0 and T1, the tester conventionally writes the initial test data to the matrix cell under test. For example, during a leakage test, the tester writes the first logic level to the matrix cell under test and also writes the second logic level to the surrounding cells. For clarity, the details of this writing are omitted from FIGS. 3A–4B.

During the next clock cycle T1, the test circuit continues to drive the MODE command onto the COMMAND bus and drives a CLOAK REPAIR key onto the ADDRESS bus. In response, the circuit 34 generates an active logic 1 for CLOAK. Because both REDDIS and CLOAK are active logic 1, the NAND gate 36 generates a logic 0 on the line 21, thus disabling the NAND gate 38.

During the clock cycle T2, the tester drives a conventional command ACTIVE onto the COMMAND bus and the address of the functional row onto the ADDRESS bus. Because the addressed row is live, the redundancy circuit 30 generates an inactive logic 0 for MATCH to indicate that the circuit 30 is not programmed to replace the addressed matrix row with a redundant row. Because MATCH is inactive logic 0 and the NAND gate 38 is disabled the NAND gate 38 generates an inactive logic 1 for $\overline{\text{MATCH}}$, which enables the row decoder 28 to fire the addressed row of matrix cells 20. Furthermore, because both REDPRE and MATCH are inactive logic 0, the XNOR gate 40 provides a logic 1 to an input terminal of the NAND gate 42, the other input of which receives the active logic 1 for CLOAK. Thus, the NAND gate 42 generates an active logic 0 for a signal $\overline{\text{WRITE\_DIS}}$ (write disable), which disables the write circuit 32 from coupling the CLOAK DATA (during clock cycle T3 as discussed below) from the DATA bus to the addressed row of matrix cells 20.

During the clock cycle T3, the tester drives the column address of the matrix cells 20 to be read onto the ADDRESS bus, a WRITE command onto the COMMAND bus, and the CLOAK DATA onto the DATA bus. As discussed above, the CLOAK DATA has the same value of the initial test data written to the cells 20 during the interval IT, and thus the same value that the tester expects to read back from the cells 20 if they are functioning properly. But as stated above, because the addressed row is live, the cloak circuit 24 disables the write circuit 32 and thus prevents the writing of the CLOAK DATA to the addressed matrix cells 20.

During the clock cycle T4, the tester drives a READ command onto the COMMAND bus and the same column address onto the ADDRESS bus. If the value of DATA OUT that the tester reads from the addressed matrix cells 20 is the same as the initial test data written during the interval IT, the tester determines that the cells are functioning properly. If the value of DATA OUT is different than the initial test data, then the tester notes that an error has occurred and stores this information for subsequent analysis.

During the clock cycle T5, the tester drives conventional PRECHARGE and BANK commands onto the COMMAND and ADDRESS buses, respectively, in anticipation of addressing the next matrix row.

Figure 3B:
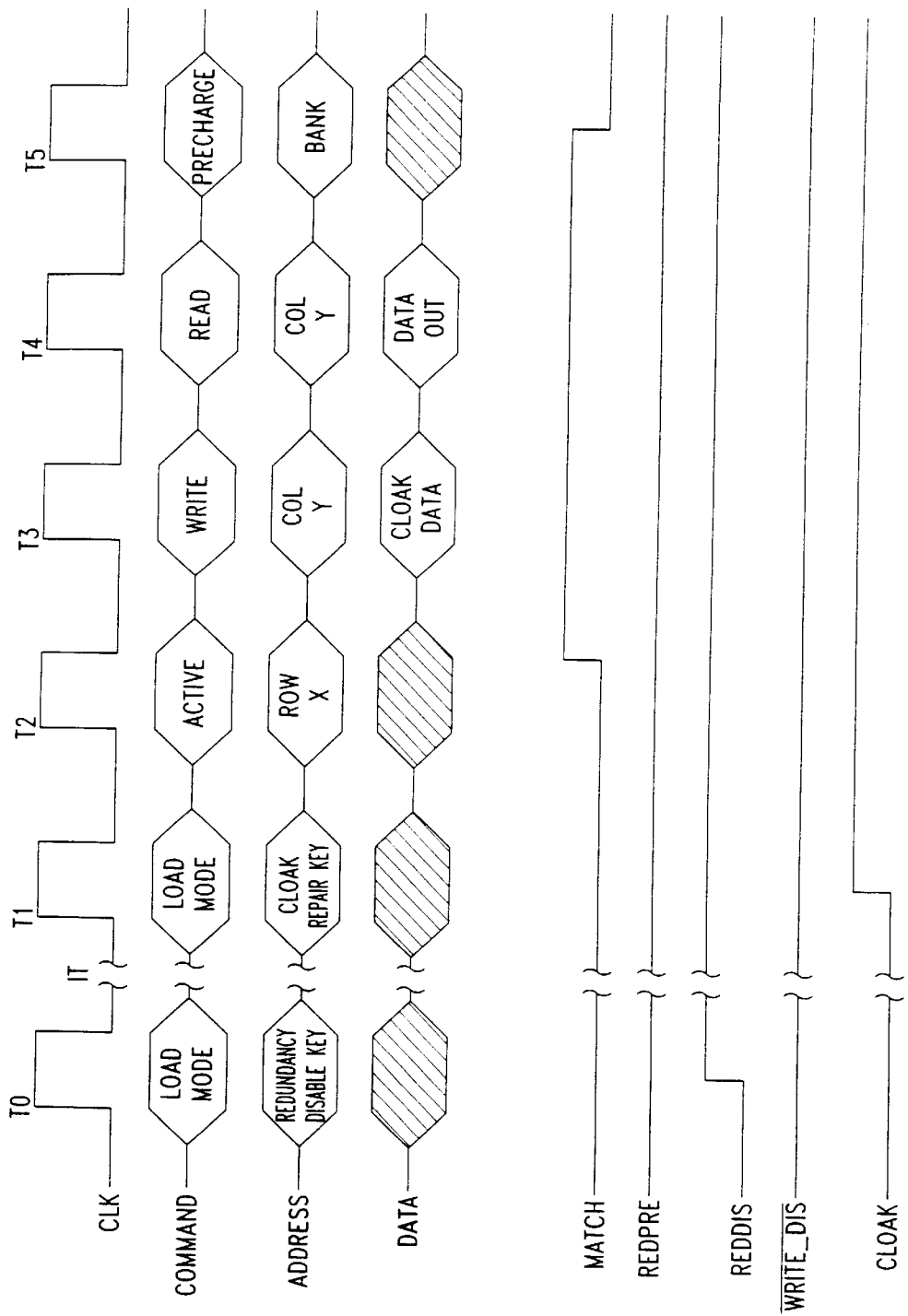
FIG. 3B is a timing diagram for the signals of FIG. 2 during testing of a redundant cell that is not mapped to replace a defective memory cell.

FIG. 3B is a timing diagram of the signals of FIG. 2 when the addressed row of matrix cells 12 is dormant. Therefore, as discussed below, the cloak circuit 24 enables data cloaking for this dormant row. Referring to FIGS. 2 and 3B, during the clock cycles T0 and T1, the REDUNDANCY DISABLE and CLOAK REPAIR keys are entered and the tester writes the initial test data during the interval IT as discussed above in conjunction with FIG. 3A. During clock cycle T2, the address of the dormant matrix row causes the redundancy circuit 30 to generate an active logic 1 for MATCH. But because the output of the NAND gate 36 is logic 0 as discussed above in conjunction with FIG. 3A, the NAND gate 38 is disabled and thus outputs an inactive logic 1 for $\overline{\text{MATCH}}$, thus allowing the row decoder 28 to fire the dormant matrix row. Furthermore, the active logic 1 for REDDIS prevents the redundant circuit 30 from firing the corresponding redundant row that is mapped to replace the dormant matrix row. In response to the logic 0 for REDPRE and the logic 1 for MATCH, the XNOR gate 40 generates a logic 0, which cause the NAND gate 42 to generate an inactive logic 1 for $\overline{\text{WRIT\_DIS}}$. Thus, the write circuit 32 is enabled.

During the clock cycle T3, the enabled write circuit 32 couples the CLOAK DATA from the DATA bus to the matrix cells 20 in the addressed column. The sense amplifiers (which, although not shown, are each similar to the conventional sense amplifier 15 of FIG. 1) coupled to the cells 20 acquire the same value as the CLOAK DATA, and attempt to write the CLOAK DATA to the addressed cells 20. But even if the cells 20 are defective and do not store the CLOAK DATA, the sense amplifiers will hold the CLOAK DATA as long as they remain active and no other data is coupled to them. Thus, during the clock cycle T4, the tester reads back the CLOAK DATA from the sense amplifiers. Because, as discussed above, the CLOAK DATA has the same value as the initial test data that the tester wrote to the cells 20, the tester determines that no error has occurred, and thus effectively ignores any errors from the dormant matrix row.

Although the described embodiment of the control circuit 16 discloses replacing an entire row when a matrix cell 20 is defective, other embodiments of the control circuit 16 replace only the defective matrix cell 20 the column including the cell 20 instead of the row, or both the row and the column including the cell 20.

Figure 4A:
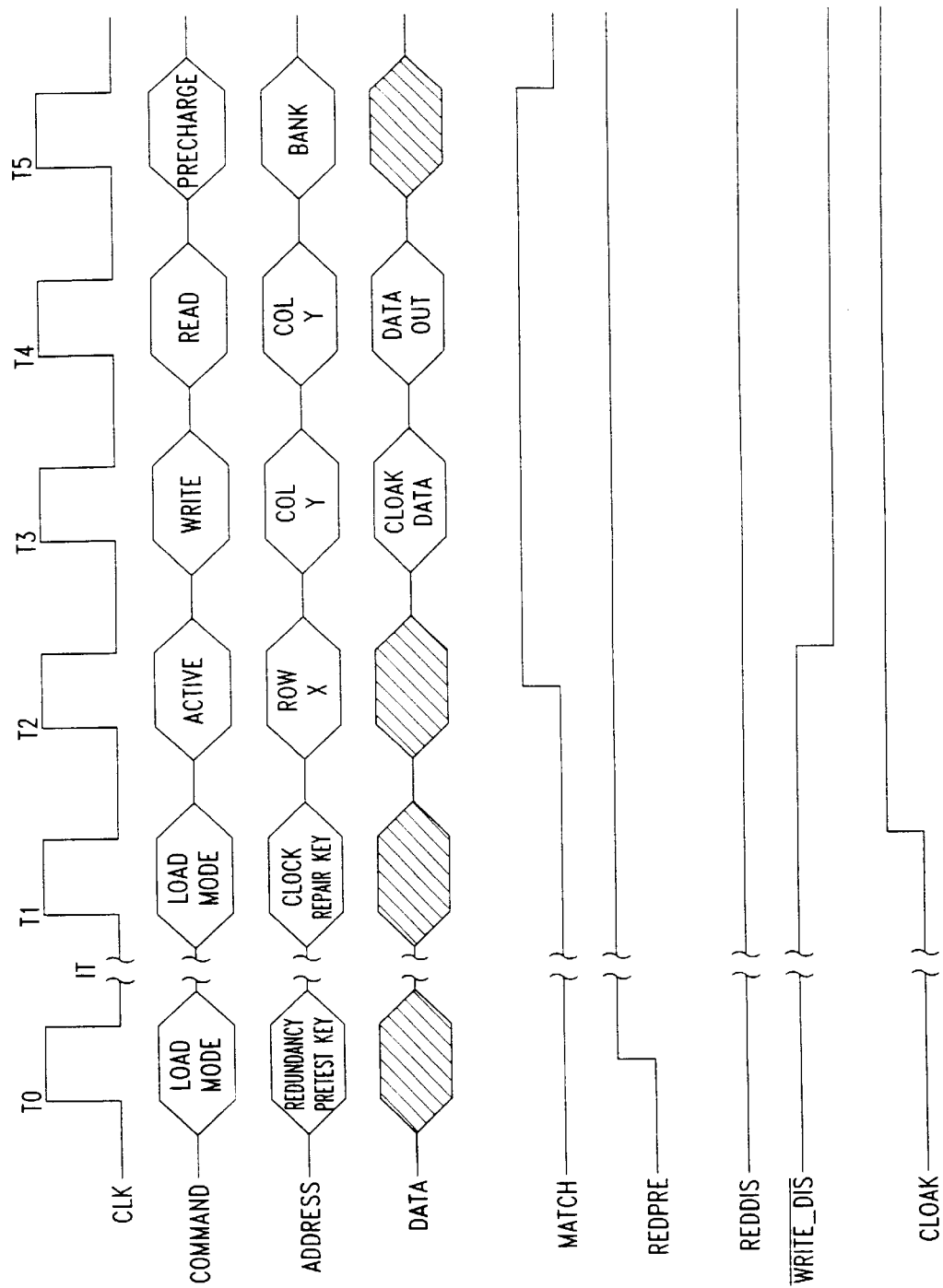
FIG. 4A is a timing diagram for the signals of FIG. 2 during testing of a matrix cell that is not replaced with a redundant cell.

FIG. 4A is a timing diagram for the signals of FIG. 2 during the redundancy pretest mode where the addressed row of redundant cells 22 is live. Therefore, as discussed below, the cloak circuit 24 disables data cloaking for this live redundant row. Referring to FIGS. 2 and 4A, the REDUNDANCY PRETEST and CLOAK REPAIR keys are entered during clock cycles T0 and T1, and during the interval IT, the tester writes the initial test data to the addressed redundant row. In response to these keys, the test mode circuit 34 generates REDPRE and CLOAK active logic 1, and continues to generate an inactive logic 0 for REDDIS.

During the clock cycle T2, the tester addresses the redundant row. In response to REDPRE being active logic 1, the redundancy circuit 30 accepts the address on the ADDRESS bus and fires the addressed redundant row. (In the redundancy pretest mode, the redundant rows can be directly addressed via the redundancy circuit 30 in a conventional manner as discussed above.) Because the addressed redundant row has been mapped to the address of a defective row of matrix cells 20, the redundancy circuit 30 generates an active logic 1 for MATCH. In response to an active logic 1 for both REDPRE and MATCH, the XNOR gate 40 generates a logic 1. This logic 1 and the logic 1 for cloak cause the NAND gate 42 to generate an active logic 0 for $\overline{\text{WRITE\_DIS}}$ and to thus disable the write circuit 32.

During clock cycle T3, the disabled write circuit 32 does not couple the CLOAK DATA to the addressed row of redundant cells 22. During the clock cycle T4, if DATA OUT has the same value as the initial test data, the tester determines that the addressed redundant cells 22 are operating properly. If DATA OUT does not have the same value, the tester detects an error.

Figure 4B:
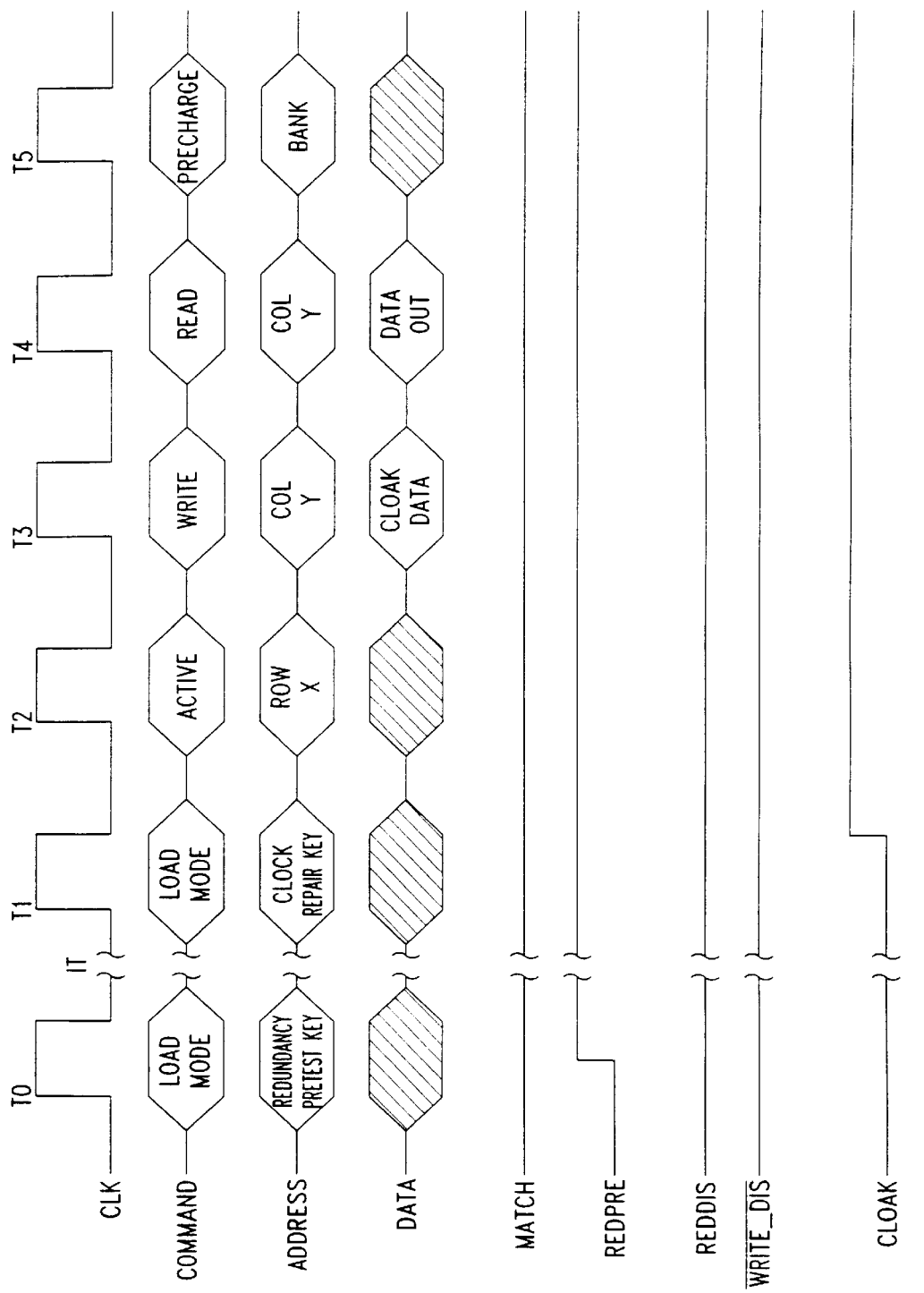
FIG. 4B is a timing diagram for the signals of FIG. 2 during testing of a matrix cell that is replaced with a redundant cell.

FIG. 4B is a timing diagram of the signals of FIG. 2 during the redundancy pretest mode when the addressed row of redundant cells 22 has not been mapped to the addresses of a row of defective matrix cells 20. That is, the addressed redundant row is dormant. Therefore, as discussed below, the cloak circuit 24 enables data cloaking for this dormant redundant row. Referring to FIGS. 2 and 4B, the REDUNDANCY PRETEST and CLOAK REPAIR keys are entered during clock cycles T0 and T1, and the tester writes the initial test data to the cells 22 in the dormant row during the interval IT as discussed above. During cycle T2, the dormant row is addressed. Because the addressed redundant row has not been mapped to replace a defective matrix row, the redundancy circuit 30 generates an inactive logic 0 for MATCH. Thus, the XNOR gate 40 generates a logic 0, which causes the NAND gate 42 to generate an inactive logic 1 for $\overline{\text{WRITE\_DIS}}$ and to thus enable the write circuit 32. During the clock cycle T3, the enabled write circuit 32 couples the CLOAK DATA to the sense amplifiers for the addressed column of redundant cells 22. During the clock cycle T4, the tester reads back the CLOAK DATA from the sense amplifiers, and thus effectively ignores any errors from the addressed dormant redundant cells 22.

Figure 5:
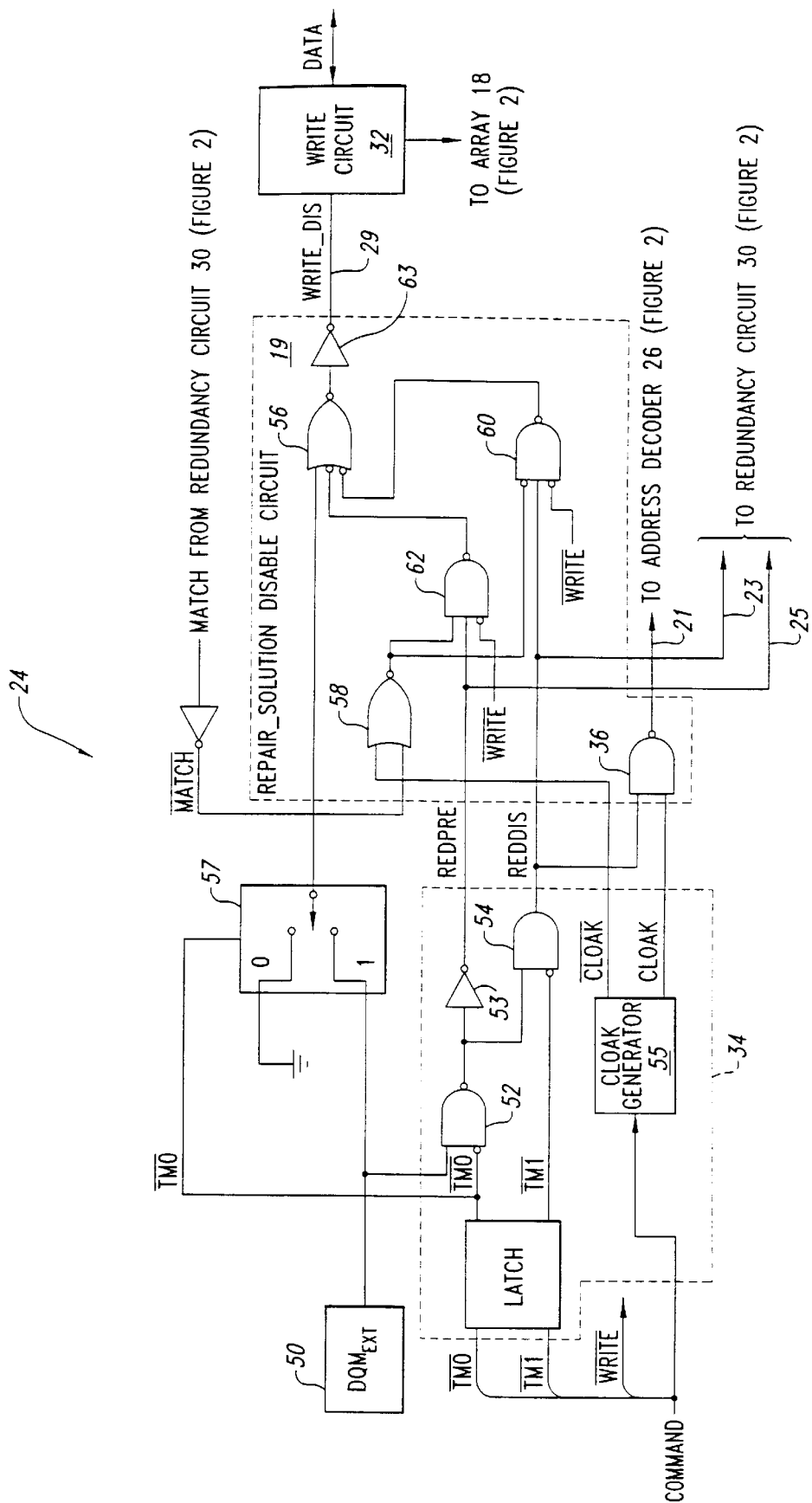
FIG. 5 is a schematic diagram of another embodiment of the cloak control circuit of FIG. 2.

FIG. 5 is another embodiment of the cloak control circuit 24 of FIG. 2 that is particularly suited for use in a DRAM. The circuit 24 receives a signal $\text{DQM}_{EXT}$ on an externally accessible pad 50 and controls the write circuit 32. The test mode circuit 34 receives signals $\overline{\text{TM0}}$, $\overline{\text{TM1}}$, and $\overline{\text{WRITE}}$ from the command bus, latches $\overline{\text{TM0}}$ and $\overline{\text{TM1}}$, and generates REDPRE, REDDIS, CLOAK and $\overline{\text{CLOAK}}$ with a NAND gate 52, inverter 53, AND gate 54, and cloak generator 55. The repair-solution disable circuit 19 generates $\overline{\text{WRITE\_DIS}}$, which is active logic 1 in this embodiment, as discussed below.

More specifically, the circuit 24 operates according to the following truth table:

Truth Table

| $\text{DQM}_{EXT}$ | $\overline{\text{TM1}}$ | $\overline{\text{TM0}}$ | $\overline{\text{CLOAK}}$ | MATCH | $\overline{\text{WRITE}}$ | WRITE_DIS | | |
|---|---|---|---|---|---|---|---|---|
| X | 1 | 1 | X | X | X | $\text{DQM}_{EXT}$ | → | $\text{WRITE\_DIS}_{INT} = \text{DQM}_{EXT}$ in normal operation |
| X | 0 | 0 | 1 | X | X | 0 | → | redundant disable or pretest without cloak |
| 0 | 0 | 0 | 0 | 0 | 0 | 0 | → | dormant row with cloak in redundant disable |
| 0 | 0 | 0 | 0 | 1 | 0 | 1 | → | live row with cloak in redundant disable |
| 1 | 0 | 0 | 0 | 0 | 0 | 1 | → | live row with cloak in redundant pretest |
| 1 | 0 | 0 | 0 | 1 | 0 | 0 | → | dormant row with cloak in redundant pretest |
| X | 0 | 0 | X | X | 1 | 0 | → | write circuit 32 enabled during writing of the initial test data |

In operation when $\overline{\text{TM0}}$ is inactive logic 1, a multiplexer 57 couples the pad 50 directly to a noninverting input of a NOR gate 56. NAND gates 60 and 62 each generate a logic 1, which is inverted to a logic 0 at the inverting inputs of the NOR gate 56 such that WRITE_DIS equals $\text{DQM}_{EXT}$. When both $\overline{\text{TM0}}$ and $\overline{\text{TM1}}$ are active logic 0, then the multiplexer 57 couples a logic 0 to the NOR gate 56, and the test mode circuit 34 generates REDPRE active logic 1 and REDDIS inactive logic 0 to enter the redundant pretest mode when $DQM_{EXT}$ is logic 1, and generates REDDIS active logic 1 and REDPRE inactive logic 0 to enter the redundant disable mode when $DQM_{EXT}$ is logic 0. Depending on other signals (not shown in FIG. 5 for clarity) on the COMMAND bus, the cloak generator 55 generates CLOAK equal to inactive logic 0 and $\overline{CLOAK}$ equal to inactive logic 1 to disable data cloaking, and CLOAK equal to active logic 1 and $\overline{CLOAK}$ equal to active logic 0 to enable data cloaking.

During the redundant disable mode with data cloaking enabled, REDDIS is active logic 1, REDPRE is inactive logic 0, CLOAK is active logic 1, and $\overline{CLOAK}$ is active logic 0. If the addressed row of matrix cells 20 (FIG. 2) is dormant, then $\overline{MATCH}$ is active logic 0. In response to a logic 0 for both $\overline{CLOAK}$ and $\overline{MATCH}$, a NOR gate 58 generates a logic 1, which is inverted to a logic 0 at the input of the NAND gate 60. This causes the NAND gate 60 to generate a logic 1, which is inverted to a logic 0 at the input of the NOR gate 56. Because REDPRE is logic 0, the output of the NAND gate 62 is also logic 1, which is inverted to a logic 0 at the input of the NOR gate 56. Therefore, because all of its inputs are at logic 0, the NOR gate 56 generates a logic 1. which is inverted by an inverter 63 to an inactive logic 0 for WRITE_DIS, thus enabling the write circuitry 52 to couple cloak data from the DATA bus to the addressed matrix row. Conversely, if the addressed row of matrix cells 20 is live, then $\overline{MATCH}$ is inactive logic 1. This causes the NOR gate 58 to generate a logic 0, which is inverted to a logic 1 at the input of the NAND gate 60. Because the active logic 0 for $\overline{WRITE}$ is inverted to logic 1 at the input of the NAND gate 60 and because REDDIS is also a logic 1, the NAND gate 60 generates a logic 0, which is inverted to a logic 1 at the input of the NOR gate 56. This causes the NOR gate 56 to generate a logic 0, which the inverter 63 inverts to an active logic 1 for WRITE_DIS to disable the write circuit 52 from coupling cloak data from the DATA bus to the addressed row of matrix cells 20.

During the redundant pretest mode, REDDIS is inactive logic 0 and REDPRE is active logic 1. If the addressed row of redundant cells 22 (FIG. 2) is dormant, then $\overline{MATCH}$ is inactive logic 1. In response to this and an active logic 0 for $\overline{CLOAK}$, the NOR gate 58 generates a logic 0, which causes the NAND gate 62 to generate a logic 1. This logic 1 is inverted to a logic 0 at the input of the NOR gate 56. Because all of its inputs are at logic 0, the NOR gate 56 generates a logic 1, which the inverter 63 inverts to an inactive logic 0 for WRITE_DIS thus enabling the write circuitry 32 to couple the cloak data from the DATA bus to the addressed redundant row. Conversely, if the addressed row of redundant cells 22 is live, then $\overline{MATCH}$ is active logic 0. This causes the NOR gate 58 to generate a logic 1. Because the active logic 0 for $\overline{WRITE}$ is inverted to logic 1 at the input of the NAND gate 62 and because REDPRE is also a logic 1, the NAND gate 62 generates a logic 0, which is inverted to a logic 1 at the input of the NOR gate 56. This causes the NOR gate 56 to generate a logic 0, which the inverter 63 inverts to an active logic 1 for WRITE_DIS, thus disabling the write circuit 32 from coupling cloak data from the DATA bus to the addressed row of live redundant cells 22.

In another embodiment, the circuitry and cloaking techniques discussed above in conjunction with FIGS. 2–5 are used to identify dormant matrix and redundant rows. Specifically, instead of writing cloak data that corresponds to the initial test data, the tester purposely attempts to write cloak data that does not correspond to the initial test data. As discussed above, the control circuit 16 of FIG. 2 only enables the write circuit 32 to write the cloak data when the addressed row is dormant. Therefore, when the tester reads a live row, it does not read the noncorresponding cloak data. When the tester reads a dormant row, however, the tester reads the noncorresponding cloak data, which insures that the tester detects an error for each of the cells in the dormant row. Thus, when analyzing the test data, rows in which all of the cells are defective are easily identified as dormant rows. Similar techniques can be used to identify individual dormant cells or dormant columns of cells.

Figure 6:
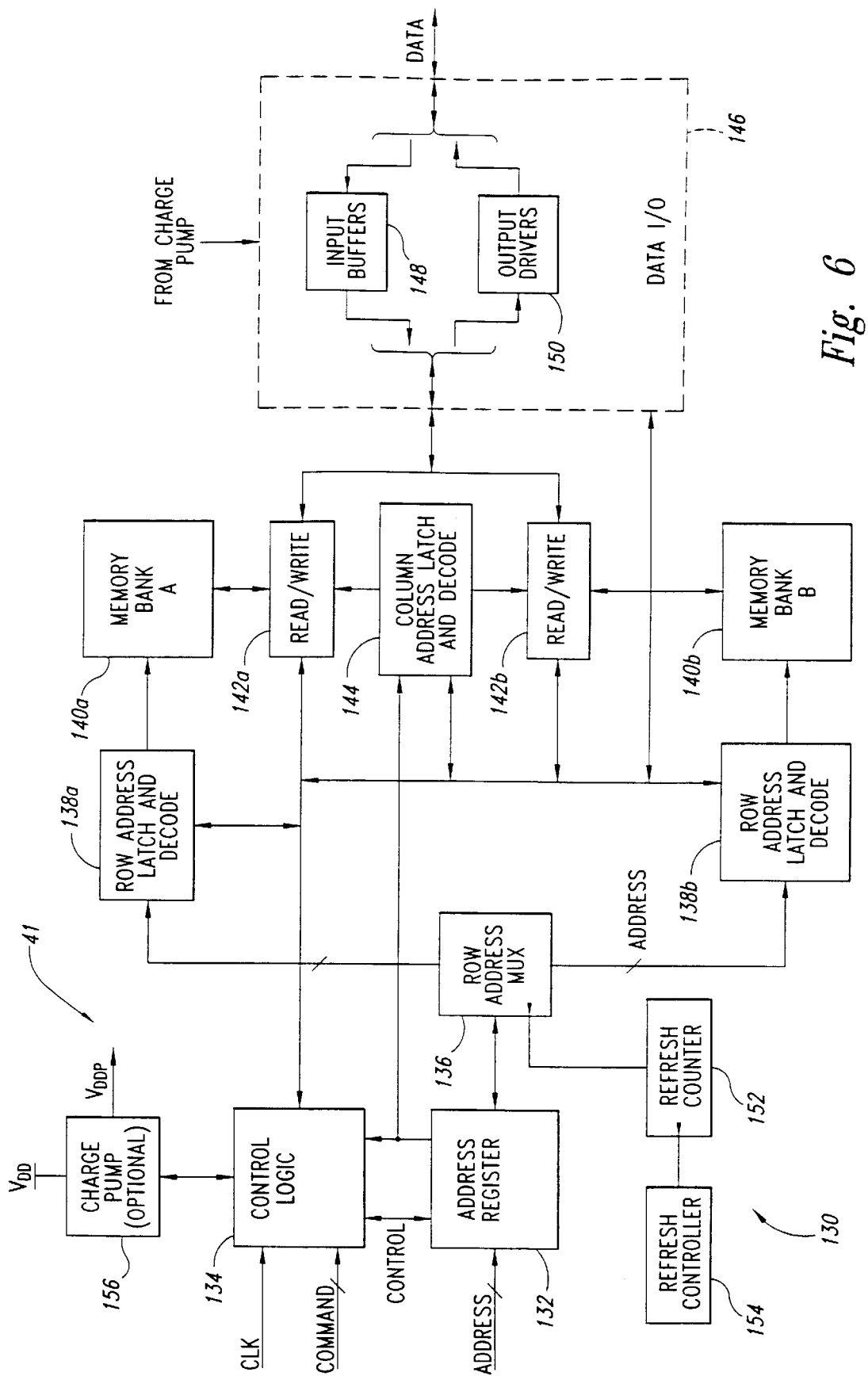
FIG. 6 is a schematic block diagram of an embodiment of a memory circuit that includes the control circuit of FIG. 2.

FIG. 6 is a block diagram of a memory circuit 130, which incorporates the control circuit 16 of FIG. 2. The memory circuit 130 includes an address register 132, which receives an address from an ADDRESS bus. A control logic circuit 134 receives a clock (CLK) signal, and receives clock enable (CKE), chip select ($\overline{CS}$), row address strobe ($\overline{RAS}$), column address strobe ($\overline{CAS}$), write enable ($\overline{WE}$), and the load test mode signals (FIGS. 3A–4B) from the COMMAND bus, and communicates with the other circuits of the memory circuit 130. A row address multiplexer 136 receives the address signal from the address register 132 and provides the row address to the row-address latch-and-decode circuits 138a and 138b for the memory bank 140a or 140b, respectively. During read and write cycles, the row-address latch-and-decode circuits 138a and 138b activate the word lines of the addressed rows of memory cells in the memory banks 140a and 140b, respectively. Read/write circuits 142a and 142b read data from the addressed memory cells in the memory banks 140a and 140b, respectively, during a read cycle, and write data to the addressed memory cells during a write cycle. A column-address latch-and-decode circuit 144 receives the address from the address register 132 and provides the column address of the selected memory cells to the read/write circuits 142a and 142b. For clarity, the address register 132, the row-address multiplexer 136, the row-address latch-and-decode circuits 138a and 138b, and the column-address latch-and-decode circuit 144 can be collectively referred to as an address decoder. In one embodiment, the address decoder is similar to the address decoder 26 of FIG. 2, the control logic 134 incorporates the cloak control circuit 24 of FIG. 2, and the memory banks 140a and 140b are each similar to the array 18 of FIG. 2.

A data input/output (I/O) circuit 146 includes a plurality of input buffers 148. During a write cycle, the buffers 148 receive and store data from the DATA bus, and the read/write circuits 142a and 142b provide the stored data to the memory banks 140a and 140b, respectively. The data I/O circuit 146 also includes a plurality of output drivers 150. During a read cycle, the read/write circuits 142a and 142b provide data from the memory banks 140a and 140b, respectively, to the drivers 150, which in turn provide this data to the DATA bus. In one embodiment, the input buffers 148 are similar to the write circuit 32 of FIG. 2.

A refresh counter 152 stores the address of the row of memory cells to be refreshed either during a conventional auto-refresh mode or self-refresh mode. After the row is refreshed, a refresh controller 154 updates the address in the refresh counter 152, typically by either incrementing or decrementing the contents of the refresh counter 152 by one. Although shown separately, the refresh controller 154 may be part of the control logic 134 in other embodiments of the memory circuit 130.

The memory circuit 130 may also include an optional charge pump 156, which steps up the power-supply voltage $V_{DD}$ to a voltage $V_{DDP}$. In one embodiment, the pump 156 generates $V_{DDP}$ approximately 1–1.5 V higher than $V_{DD}$. The memory circuit 130 may also use $V_{DDP}$ to conventionally overdrive selected internal transistors.

Figure 7:
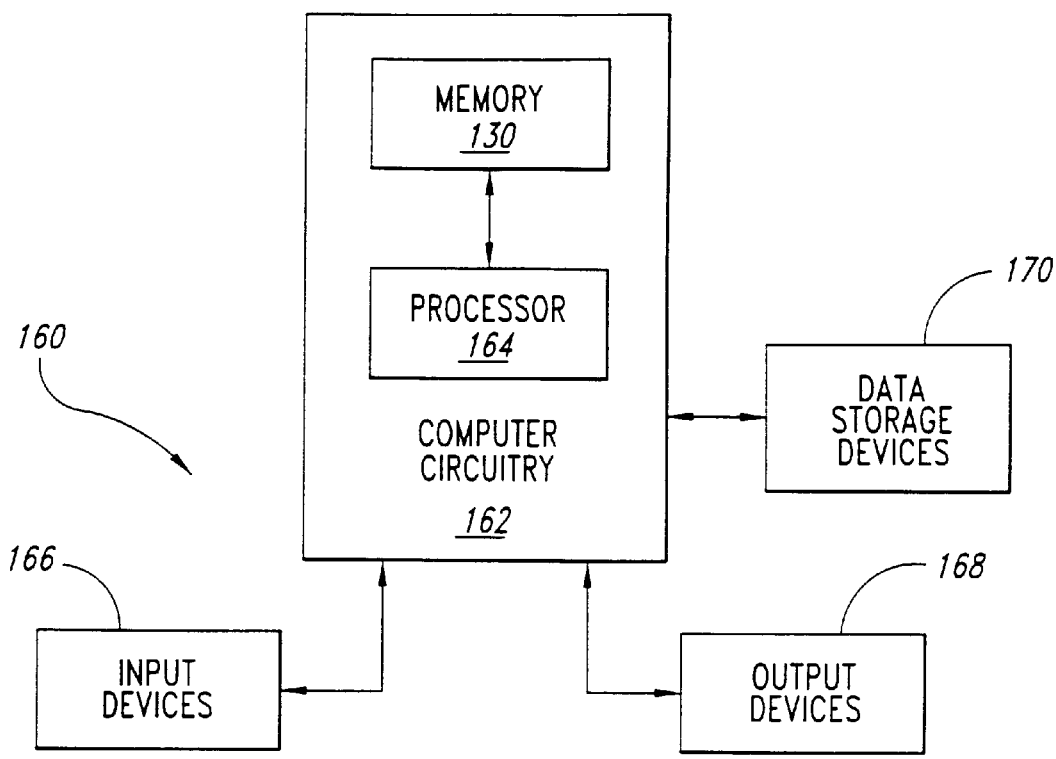
FIG. 7 is a schematic block diagram of an embodiment of an electronic system that includes the memory circuit of FIG. 6.

FIG. 7 is a block diagram of an electronic system 160, such as a computer system, that incorporates the memory circuit 130 of FIG. 6. The system 160 includes the computer circuitry 162 for performing computer functions, such as executing software to perform desired calculations and tasks. The circuitry 162 typically includes a processor 164 and the memory circuit 130, which is coupled to the processor 164. One or more input devices 166, such as a keyboard or a mouse, are coupled to the computer circuitry 162 and allow an operator (not shown) to manually input data thereto. One or more output devices 168 are coupled to the computer circuitry 162 to provide to the operator data generated by the computer circuitry 162. Examples of such output devices 168 include a printer and a video display unit. One or more data-storage devices 170 are coupled to the computer circuitry 162 to store data on or retrieve data from external storage media (not shown). Examples of the storage devices 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory circuit 130.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device, comprising:
    an array of memory cells, at least one of the memory cells being a live memory cell and at least one of the memory cells being a dormant memory cell;
    a storage circuit coupled to the array of memory cells;
    a write circuit coupled to the array of memory cells and operable to receive write data and couple the write data to the array of memory cells;
    a read circuit coupled to the array of memory cells and operable to receive read data from the array of memory cells and to couple the read data from the read circuit;
    an addressing circuit coupled to the array of memory cells, the addressing circuit being operable to receive a memory address and access at least one of the memory cells in the array corresponding to the received memory address; and
    a control circuit coupled to the array of memory cells, the write circuit, the read circuit, the addressing circuit and the storage circuit, the control circuit being operable to enable the write circuit to write data to the addressed memory cell if the addressed memory cell is a live memory cell, to enable the write circuit to write data to the storage circuit if the addressed memory cell is a dormant redundant memory cell, to enable the read circuit to read data from an addressed memory cell if the addressed memory cell, and to enable the read circuit to read data from the storage circuit if the addressed memory cell is a dormant redundant memory cell so that read data is provided by the memory cell if the memory cell is a live memory cell and the read data is provided by the storage circuit if the memory cell is a dormant redundant memory cell.

2. The memory device of claim 1 wherein the control circuit is operable to disable the write circuit from coupling the data to the storage circuit if the addressed memory cell is a live memory cell.

3. The memory device of claim 1 wherein the storage circuit coupled to the array of memory cells comprises a plurality of sense amplifiers.

4. The memory device of claim 1 wherein the storage circuit coupled to the array of memory cells comprises a plurality of latches.

5. The memory device of claim 1, wherein the memory cells in the array comprise dynamic random access memory cells.

6. A computer system, comprising:
    a processor having a processor bus;
    an input device coupled to the processor through the processor bus and adapted to allow data to be entered into the computer system;
    an output device coupled to the processor through the processor bus adapted to allow data to be output from the computer system; and
    a memory device coupled to the processor through the processor bus, the memory device comprising:
        an array of memory cells, at least one of the memory cells being a live memory cell and at least one of the memory cells being a dormant memory cell;
        a storage circuit coupled to the array of memory cells;
        a write circuit coupled to the array of memory cells and operable to receive write data and couple the write data to the array of memory cells;
        a read circuit coupled to the array of memory cells and operable to receive read data from the array of memory cells and to couple the read data from the read circuit;
        an addressing circuit coupled to the array of memory cells, the addressing circuit being operable to receive a memory address and access at least one of the memory cells in the array corresponding to the received memory address; and
        a control circuit coupled to the array of memory cells, the write circuit, the read circuit, the addressing circuit and the storage circuit, the control circuit being operable to enable the write circuit to write data to the addressed memory cell if the addressed memory cell is a live memory cell, to enable the write circuit to write data to the storage circuit if the addressed memory cell is a dormant redundant memory cell, to enable the read circuit to read data from an addressed memory cell if the addressed memory cell is a live memory cell, and to enable the read circuit to read data from the storage circuit if the addressed memory cell is a dormant redundant memory cell so that read data is provided by the memory cell if the memory cell is a live memory cell and the read data is provided by the storage circuit if the memory cell is a dormant redundant memory cell.

7. The computer system of claim 6 wherein the control circuit is operable to disable the write circuit from coupling the data to the storage circuit if the addressed memory cell is a live memory cell.

8. The computer system of claim 6 wherein the storage circuit coupled to the array of memory cells comprises a plurality of sense amplifiers.

9. The computer system of claim 6 wherein the storage circuit coupled to the array of memory cells comprises a plurality of latches.

10. The computer system of claim 6, wherein the memory cells in the array comprise dynamic random access memory cells.

11. A method for testing a memory circuit, the method comprising:

leaving a redundant memory cell unmapped to an address of a live memory cell to render the redundant cell dormant;

addressing a plurality of memory cells in an array to write data to the memory cells;

if the memory cell being addressed is the dormant redundant memory cell, than writing the data to a storage circuit other than a memory cell such that the storage circuit stores the data;

if the memory cell being addressed is a live memory cell, then writing the data to the live memory cell being addressed such that the addressed memory cell stores the data;

addressing a plurality of memory cells in an array to read data from the memory cells;

if the memory cell being addressed is the dormant redundant memory cell, then reading the data from a storage circuit other than a memory cell such that the storage circuit rather than the addressed memory cell provides the data; and if the memory cell being addressed is a live memory cell, than reading the data from the live memory cell being addressed such that the addressed memory cell provides the data.

12. The method of claim 11, further comprising:

before writing the data, determining if the memory cell being addressed is defective; and if the memory cell being addressed is defective, mapping a redundant memory cell to the address of the addressed defective memory cell to render the matrix memory cell dormant.

13. A method for testing a memory circuit, the method comprising:

determining if any rows of memory cells in the memory circuit is defective; and if a row of memory cells is defective, mapping a row of redundant memory cells to the defective row of memory cells to render the memory cells dormant;

writing initial test data to rows of memory cells;

addressing one of the rows to write data to the memory cells in the addressed row;

if the row being addressed is dormant, then writing the data to a storage circuit other than a memory cell such that the storage circuit stores the write data;

addressing one of the rows to read data from the memory cells in the addressed row; and if the row being addressed is dormant, then reading the data from the storage circuit such that the storage circuits provides the read data.

14. The method of claim 13, wherein the row being addressed to write data to the memory cells in the addressed row comprises a matrix row of matrix memory cells.

15. A method for testing a memory device, the method comprising:

writing data to a plurality of rows of memory cells;

addressing a row of memory cells to write data to the memory cells in the addressed row;

if the row of memory cell being addressed is a dormant redundant row of memory cells, then writing the data to a storage circuit other than a memory cell in the memory device such that the storage circuit stores the data;

addressing a row of memory cells in an array to read data from the memory cells in the addressed row; and if the row of memory cells being addressed is a dormant redundant row of memory cells, then reading the data from the storage circuit such that the storage circuit rather than the addressed row of memory cell provides the data.

16. The method of claim 15 further comprising inhibiting the writing of data to the storage circuit if the addressed row of memory cells is a live row of memory cells.

17. The method of claim 15 wherein the storage circuit comprises a plurality of sense amplifiers.

18. The method of claim 15 wherein the storage circuit comprises a plurality of latches.

* * * * *

UNITED STATES PATENT AND TRADEMARK OFFICE
CERTIFICATE OF CORRECTION

PATENT NO.    : 6,405,324 B2
DATED         : June 11, 2002
INVENTOR(S)   : Shore It is certified that error appears in the above-identified patent and that said Letters Patent is hereby corrected as shown below:

Title page,
Item [56], References Cited, U.S. PATENT DOCUMENTS, "6,208,570 B1 * 3/2001 Brown" should read -- 6,208,570 B1 * 3/2001 Brown et al. --

Column 5,
Line 27, "as follows." should read -- as follows: --

Column 7,
Line 18, "is addressed the" should read -- is addressed, the --
Line 32, "the inactive logic 0" should read -- the active logic 1 --

Column 9,
Line 2, "which cause" should read -- which causes --

Column 10,
Line 42, "WRITE_DIS" should read -- WRITE_DIS --

Column 13,
Line 61, "memory cell, and to enable" should read -- memory cell is a live memory cell, and to enable --

Column 16,
Line 13, "circuits provides" should read -- circuits provide --

Signed and Sealed this

Second Day of September, 2003

JAMES E. ROGAN
*Director of the United States Patent and Trademark Office*